United States Patent
Fryčák

(10) Patent No.: US 11,366,148 B2
(45) Date of Patent: Jun. 21, 2022

(54) METHOD AND DEVICE FOR MEASURING RESISTANCE OF RESISTIVE SENSOR USING AN ACTIVELY CONTROLLED RESISTOR NETWORK

(71) Applicant: Univerzita Palackého v Olomouci, Olomouc (CZ)

(72) Inventor: Petr Fryčák, Olomouc (CZ)

(73) Assignee: Univerzita Palackého v Olomouci, Olomouc (CZ)

( * ) Notice: Subject to any disclaimer, the term of this patent is extended or adjusted under 35 U.S.C. 154(b) by 74 days.

(21) Appl. No.: 17/043,602

(22) PCT Filed: Mar. 29, 2019

(86) PCT No.: PCT/CZ2019/050014
§ 371 (c)(1),
(2) Date: Sep. 29, 2020

(87) PCT Pub. No.: WO2019/185070
PCT Pub. Date: Oct. 3, 2019

(65) Prior Publication Data
US 2021/0025928 A1    Jan. 28, 2021

(30) Foreign Application Priority Data
Mar. 30, 2018 (CZ) ................ CZ2018-158

(51) Int. Cl.
*G01R 27/14* (2006.01)
*G01R 15/04* (2006.01)
*G01R 15/08* (2006.01)

(52) U.S. Cl.
CPC ............. *G01R 27/14* (2013.01); *G01R 15/04* (2013.01); *G01R 15/08* (2013.01)

(58) Field of Classification Search
CPC ........ G01R 27/14; G01R 15/04; G01R 15/08; G01R 27/02; G01R 31/00; G01R 31/2889;
(Continued)

(56) References Cited

U.S. PATENT DOCUMENTS 4,264,860 A * 4/1981 Thebault ................ G01R 27/14
                                                324/707
4,342,089 A    7/1982 Hall
(Continued)

FOREIGN PATENT DOCUMENTS

CZ       2016-398 A3    5/2017
EP       1251357 B1    9/2003
(Continued)

OTHER PUBLICATIONS

PCT International Search Report in International Application No. PCT/CZ2019/050014, dated Aug. 9, 2019.
(Continued)

*Primary Examiner* — Vinh P Nguyen
(74) *Attorney, Agent, or Firm* — Nixon Peabody LLP

(57) ABSTRACT

The present disclosure refers to a method of measuring resistance of the resistive sensor (5), where the value of resistance of the resistive sensor (5) is determined from its series connection with actively controlled resistor network (3) with selectable value of resistance and with a periodic waveform voltage source (7), and further a device for measuring resistance of the resistive sensor (5) including a periodic waveform voltage source (7), actively controlled resistor network (3), and a resistive sensor (5), wherein the terminals of the periodic waveform voltage source (7) are connected to the first node (2) and the third node (6), terminals of actively controlled resistor network (3) are connected to the first node (2) and the second node (4), and
(Continued)

terminals of the resistive sensor are connected to the second node (4) and the third node (6), thus forming a connection in a resistive voltage divider with an automatic selection of one resistor of the divider, and usage of this method for measuring time-varying resistance of the sensor.

14 Claims, 5 Drawing Sheets

(58) Field of Classification Search
CPC ...... G01R 17/105; G01R 1/203; G01R 31/52; G01R 19/0084; G01R 31/3835; G01R 27/025; G01R 27/18; G01R 27/205; G11C 29/56; G06F 2203/04113; G06F 3/04

See application file for complete search history.

(56) References Cited

U.S. PATENT DOCUMENTS

| | | | |
|---|---|---|---|
| 4,408,282 A * | 10/1983 | Hof | G01N 27/223 702/65 |
| 4,578,635 A | 3/1986 | Mee et al. | |
| 4,950,998 A | 8/1990 | Kramer et al. | |
| 5,373,410 A * | 12/1994 | Schreiber | G01R 15/04 361/119 |
| 5,608,333 A * | 3/1997 | Hayashi | G01R 17/105 324/705 |
| 5,708,363 A | 1/1998 | Yates et al. | |
| 6,690,183 B2 * | 2/2004 | Braun | G01R 27/02 324/711 |
| 10,317,450 B2 * | 6/2019 | Fryčák | G01R 31/001 |
| 11,162,990 B2 * | 11/2021 | Nakamura | G01R 15/04 |
| 2006/0144165 A1 | 7/2006 | Pietsch et al. | |
| 2018/0003758 A1 | 1/2018 | Frycak | |

FOREIGN PATENT DOCUMENTS

| | | |
|---|---|---|
| GB | 895230 A | 5/1962 |
| GB | 1403818 A | 8/1975 |
| GB | 2535745 A | 8/2016 |
| WO | 2010049298 A1 | 5/2010 |

OTHER PUBLICATIONS

CZ Search Report in International CZ Application No. PV 2018-158, dated Dec. 13, 2018.
PCT International Preliminary Report on Patentability in International Application No. PCT/CZ2019/050014, dated Jun. 3, 2020.

* cited by examiner

METHOD AND DEVICE FOR MEASURING RESISTANCE OF RESISTIVE SENSOR USING AN ACTIVELY CONTROLLED RESISTOR NETWORK

CROSS REFERENCE TO RELATED APPLICATIONS

This application is the National Phase of International Application No. PCT/CZ2019/050014 filed Mar. 29, 2019, which claims the benefit of Czech Application No. PV 2018-158, filed Mar. 30, 2018 and entitled "Způsob a zařízení pro měření odporu rezistivního senzoru, " the entirety of which is hereby incorporated by reference.

FIELD OF THE INVENTION

The invention relates to measuring resistance of a sensor, which is controlled by a resistive divider with an automatic selection of a resistor of the divider mostly for higher accuracy, rate and safety of the process.

STATE OF THE ART

Sensing of many physical and physico-chemical quantities (e.g. temperature, luminous flux, deformation, concentration) is done by resistive sensors, the value of resistance of the sensor being in certain causal relationship with the value of measured quantity. Different measuring methods for determining the resistance of the sensor are used. Basically, it is a connection of the sensor to a simple voltage divider with a resistor of a known resistance value, connection to a resistance bridge, measuring of voltage drop during the passage of a known forced current, and measuring or integration of the passing current with a known applied voltage. The selection of particular measuring method is done with respect to the required parameters of the resulting device, such as sensitivity, range of resistance values corresponding to the full range of values of the measured quantity, response rate, power consumption, simplicity, reliability, production costs, etc.

Insight to the State of the Art can be brought in by a patent no. U.S. Pat. No. 5,708,363 Liquid conductivity measurement system using a variable frequency AC voltage. Range of the device is changed by switching between several resistors. Patent no. GB 895,230 presents a device for measuring an impedance, where the range is also controlled by switching resistors in order to change the total resistance of a calibrating part of the circuit. The device is used for measuring an impedance. Another devices for measuring an impedance or other characteristics of a given sensor can be found in U.S. Pat. No. 4,342,089 or U.S. Pat. No. 4,408,282. These documents teach devices used for measuring resistance, impedance or other characteristics dependent on the previous two quantities. To change a sensitivity or a measuring range of given device, resistance of voltage divider is changed to match the resistance of a resistive sensor, at least in the order of magnitude. However, the devices are very limited in the number of options of available resistors, as only one resistor of voltage divider can be active in the circuit at the same time.

In terms of sensitivity and range, it is possible to roughly sort the sensors into two groups: (i) full range of values of the sensed quantity corresponds only to a small range of resistance of the sensor; (ii) full range of values of the sensed quantity corresponds to the change of resistance of the sensor by several orders of magnitude. Sensors in the first group are appropriately connected to a bridge arrangement. In case of sensors characterized in an order-of-magnitude change of resistance, it is preferred that the signal processing circuit allows a change of sensitivity according to the actual resistance value of the sensor. This ensures that measuring is done with sufficient resolution in the full range of values of resistance. If the output of the sensing circuit is the voltage magnitude ($U_{out}$), it is possible to define sensitivity (s) by the following relation:

$$s \equiv -\frac{dU_{out}}{dR_s}. \quad (1)$$

When connecting the sensor with resistance $R_s$ to the voltage divider with a resistor $R_d$ and applied voltage $U_{in}$, the following relation for sensitivity was derived:

$$s = -R_d U_{in} \frac{d}{dR_s}\left(\frac{1}{R_s + R_d}\right) = \frac{R_d}{(R_s + R_d)^2} U_{in}. \quad (2)$$

Sensitivity, while connected to the divider, is highest for $R_d = R_s$ and decreases to approximately a third of the highest value if the value of resistance of the resistor $R_d$ is increased or decreased by one order of magnitude with constant resistance of the sensor $R_s$.

It is possible to define the resolution of measurement by minimal detectable relative change of resistance of the sensor ($\Delta_{min}R_s/R_s$) corresponding to the minimal measurable said output voltage $\Delta_{min}U_{out}$ in given sensor connection. The quantity $\Delta_{min}R_s/R_s$ basically represents the minimal percentage change of resistance of the sensor perceptible by the given measuring device; the lower $\Delta_{min}R_s/R_s$ is, the higher is the resolution of measurement. Derivation of the relation for dependence of resolution on the ratio of resistance of the sensor $R_s$ and the resistor of the divider $R_d$ starts with the formula for output voltage when connecting the sensor to the voltage divider (FIG. 1):

$$U_{out} = \frac{R_s}{R_d + R_s} U_{in}, \quad (3)$$

where $U_{in}$ is the voltage applied on the divider.

The difference of output voltage for two different values of resistance of the sensor $R_{s,1}$ and $R_{s,2}$ is $$\Delta U_{out} = U_{out,2} - U_{out,1} = \left(\frac{R_{s,2}}{R_d + R_{s,2}} - \frac{R_{s,1}}{R_d + R_{s,1}}\right) U_{in}, \quad (4)$$

wherefrom the resistance of the sensor $R_{s,2}$ as a function $R_{s,1}$ and $\Delta U_{out}$ can be derived:

$$R_{s,2} = \frac{R_d^2 + R_d R_{s,1}\left(\frac{U_{in}}{\Delta U_{out}} + 1\right)}{R_d\left(\frac{U_{in}}{\Delta U_{out}} - 1\right) - R_{s,1}} \quad (5)$$

and minimal detectable relative change of resistance of the sensor can be then represented as $$\frac{\Delta s_{min}}{R_s \frac{R_{s,2} - R_{s,1}\left(\frac{R_d}{R_s} + 1\right)^2}{R_{s,1}\frac{R_d}{R_s}\left(\frac{U_{in}}{\Delta \text{out}_{min}} 0\right)}}. \tag{6}$$

The relation stated above is valid under the condition that $R_{s,2} \rightarrow R_{s,1}$ ($=R_s$), i.e. for small changes of resistance in comparison with the total resistance of the sensor. The dependency of $\Delta_{min}R_s/R_s$ (in percentage) on the ratio $R_d/R_s$ for $U_{in}=1$ V and $\Delta_{min}U_{out}=1$ mV (approximately corresponds to measurement using a 10-bit ADC having the input range of 0-1 V) is shown in FIG. 2. It is obvious that the resolution of measurement is getting substantially worse if $R_d$ and $R_s$ differ by more than one order of magnitude.

Thus, it is necessary to choose the resistor of the divider with respect to the optimal sensitivity and resolution of measurement, which depends on resistance of the sensor. When the resistance of the sensor varies in a wide range, a single resistor may not be sufficient, and the measuring circuit must contain more resistors connected into the divider manually or by electronic selector according to the actual values of resistance of the sensor.

Especially in the case of high resistance of the sensor, and thus of the resistor of the divider as well (MS) and higher), the measuring is complicated by electromagnetic interference (EMI) which is effectively captured by connecting conductors. EMI spreads through the space from sources such as electric wiring, switching power supplies, and all kinds of other electric and electronic devices. The effect of EMI can be limited by various means, e.g. by conductor and measuring equipment shielding or by increasing the applied voltage Urn. However, depending on the required parameters of the device and circumstances of its usage, such means can be inappropriate. Shielding increases requirements for space and can complicate the installation of the sensor into the measured environment. Increase of the applied voltage (e.g. to dozens or hundreds of volts) limits the effect of EMI and, moreover, increases the resolution (for constant $\Delta_{min}U_{out}$, see relation (6)). A disadvantage is the risk of facilitating electrochemical changes in the sensor (humidity sensors) and the necessity to provide corresponding power supply; an obstruction in this approach is that the maximum applied voltage of some types of sensors is limited.

Drawbacks of the state of the art include the necessity to shield electromagnetic interference caused by the presence of external electric fields—for example of electrical wiring in walls, radiation of electronic devices in the environment. Negative result of usage of the high voltage is a possible damage to the sensor and decrease in safety while working with the measuring device. Present solutions do not offer a measuring device with high sensitivity as well as a wide range of resistance change of the sensor.

The aim of this invention is to determine resistance of the sensor in the wide range of values, with the option of automatic selection of sensitivity on the basis of the actual value of resistance of the sensor with the highest possible sampling rate and with the usage of low voltage.

SUMMARY OF THE INVENTION

The said drawbacks are eliminated by a new method of measuring resistance of the resistive sensor including the resistive sensor connected in series with an actively controlled resistor network and with a periodic waveform voltage source, wherein actively controlled resistor network forms individual branches containing a resistor and a switching element, which can be a unipolar transistor. Individual branches, or rather resistors, are then connected into the circuit by means of switching elements, which causes the change of overall resistance of the divider, which is given by the value of resistances R0-Rn connected in parallel.

The voltage at the node between the resistive sensor and the actively controlled resistor network is a function of resistance of the resistive sensor, wherein this voltage is followed by an operational amplifier connected as voltage follower or by any other device enabling following of the voltage value.

The advantage of the invention lies in the high range of sensitivity of the measuring device due to the possibility of an order-of-magnitude change of the resistance by connecting individual branches of the actively controlled resistor network. Further advantage is the usage of alternating voltage with low amplitude which results in higher safety of work with the measuring device. Further, there is no risk of damaging the sensor by the effect of high voltage.

Preferably, it is possible to use series connection of two and more switching transistors in the branch of the actively controlled resistor network, which results in the increase of input resistance of the said branch, which then will not cause manifestations of parasitic resistance, unless it is connected into the circuit.

Further advantage of the invention is the suppression of parasitic capacitances between DRAIN and GATE electrodes of switching transistors, or between SOURCE and GATE electrodes of switching transistors, by means of superposition of the output of voltage follower on the GATE electrodes of switching transistors, which makes it possible to increase the used frequency of applied voltage and thus the response rate of the device.

In a preferred embodiment, the actively controlled resistor network contains at least two branches connected in parallel. Preferably, values of resistance of branch resistors then form geometric series. This results in the increase of the range of sensitivity of the measuring device, which can be then used also when the resistance of the resistive sensor varies by several orders of magnitude.

Another advantage of the invention is the usage of analog or digital filter at the output of the operational amplifier, which passes only the frequency of voltage source, which removes disturbances by the effect of electromagnetic interference from external electric fields.

In a preferred embodiment, a branch resistor R0 is permanently connected in the actively controlled resistor network, wherein the value of resistance of this resistor is lower than the input impedance of the operational amplifier. In this embodiment, the maximum value of the overall resistance of the actively controlled resistor network is then given by the value of resistance of the branch resistor R0.

Basically, the invention can be made in two embodiments. In the first embodiment, the branches of the actively controlled resistor network are connected in parallel to the permanently connected branch resistor R0; hence it is possible to achieve switching of individual branches independently. Due to that it is then possible to obtain more variability in the values of the overall resistance of the actively controlled resistor network. In the second embodiment, the individual branches are connected in parallel to the branch resistor of the preceding branch. In this embodiment, the branches can be switched on only if all the preceding branches are switched on.

In a preferred embodiment, the resistive sensor and the actively controlled resistor network are connected by a shielded cable, wherein the non-inverting input of the operational amplifier is connected to the shielded cable and its shielding layer to the output of the operational amplifier. With such connection, the effect of electromagnetic interference is suppressed and at the same time the undesired effect of a parasitic capacitance of the shielded cable is eliminated.

DESCRIPTION OF THE DRAWINGS

The invention is further clarified by means of exemplary embodiments, which are described by means of the attached drawings, where.

EXEMPLARY EMBODIMENT OF THE INVENTION

Figure 1:
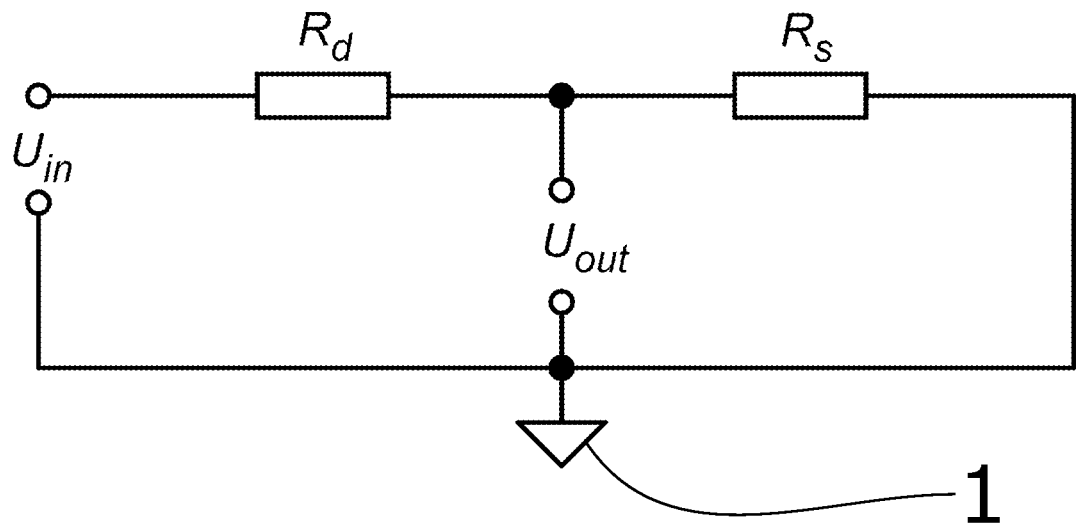
FIG. 1—is a schematic view of the connection of the resistive sensor into the voltage divider, FIG. 2—is a dependency of a minimal detectable percentage change of resistance of the sensor on the ratio of resistances of the divider resistor and the sensor according to the relation (6), FIG. 3—is a schematic view of the embodiment of the invention, FIG. 4—is a schematic view of possible mutual arrangement of two branches of the actively controlled resistor network with a resistor (R) and a unipolar transistor (T), FIG. 5—is an electric circuit diagram of a possible embodiment of the invention, FIG. 6—is an electric circuit diagram of another possible embodiment of the invention, FIG. 7—is a schematic view of the connection of the actively controlled resistor network branch.
Figure 2:
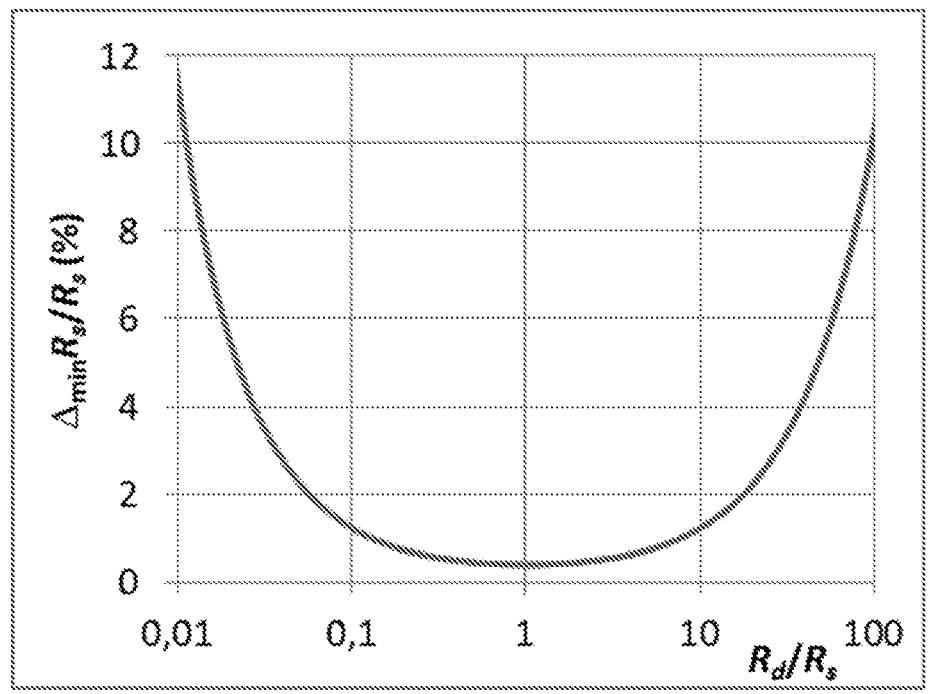
Figure 3:
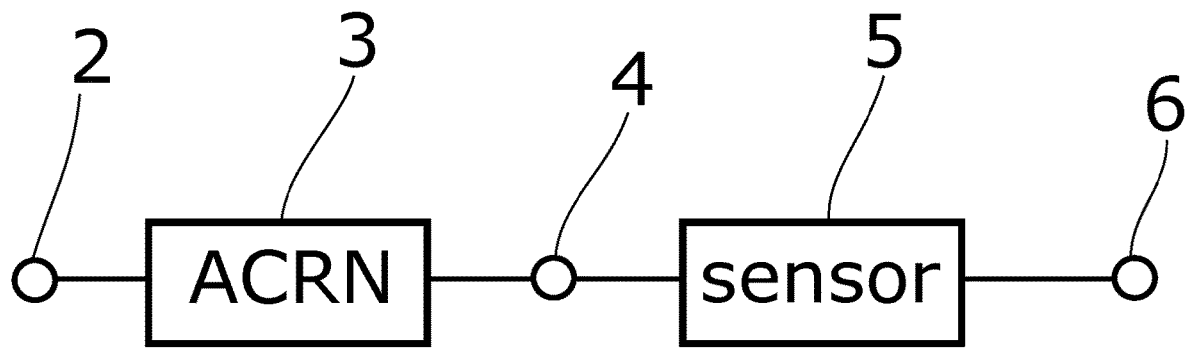
Figure 4:
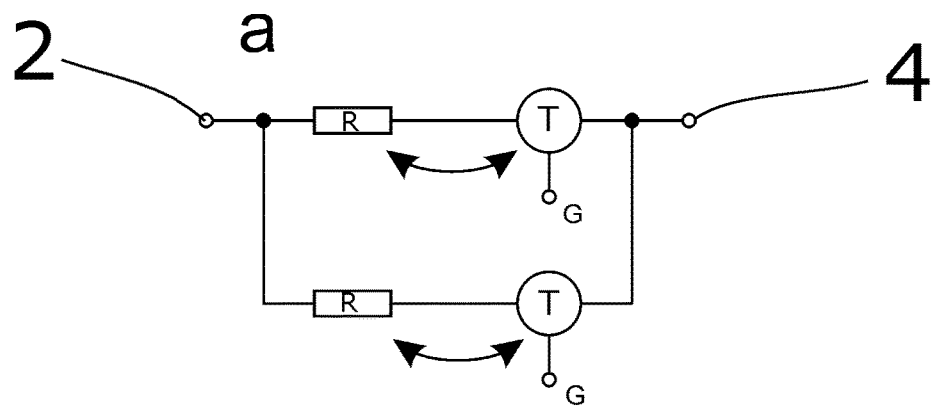
Figure 4:
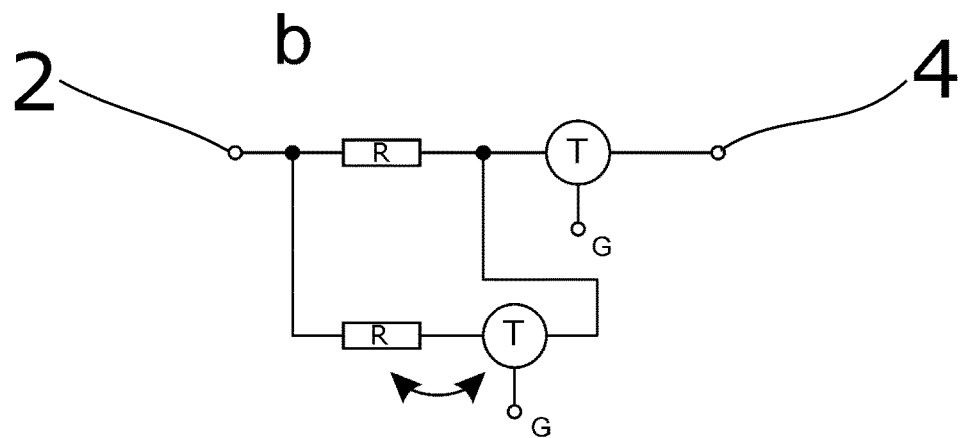

The basis of the invention is a voltage divider formed by the connection of the actively controlled resistor network 3 with two terminals between the first node 2 and the second node 4, and a sensor 5 between the second node 4 and the third node 6, see FIG. 3. The actively controlled resistor network 3 includes an arrangement of two or more branches 10 that contain an element with defined resistance (resistor) and a switching element, which is a unipolar transistor. Preferably, the switching element is formed by series connection of multiple switching transistors T1. Two ways of mutual arrangement of two branches 10 in the actively controlled resistor network 3 are apparent from FIG. 4. If a variable arrangement of the resistor and the transistor is possible, it is marked in the diagram by a two-way arrow. Other branches 10 can be added to the actively controlled resistor network 3 in an analogous manner. Connection of a given branch resistor into the divider is carried out by switching on the switching transistors, which are between the branch resistor and the first node 2, or the second node 4. The immediate value of resistance between the first node 2 and the second node 4 is further referred to as $R_{ACRN}$.

It is preferred that the values of resistances of branch resistors in individual branches 10 form a geometric series which can provide, by appropriate connection of individual resistors, sufficient resolution of measurement in case there is a change of resistance of the sensor 5 by several orders of magnitude. Further, it is preferred that one branch 10 containing branch resistor R0 with the highest value of resistance ($R_{ACRN,max}$) does not contain a switching element and is thus included into the divider permanently. The resistance of switching elements in a switched-off state should be many times higher than the highest value of resistance of resistors in the actively controlled resistor network 3. For this purpose, it is possible to use series connection of multiple switching transistors T1.

Periodic waveform voltage $u_{in}(t)$ is applied between the first node 2 and the third node 4. It is preferred to define one of the nodes 2, 6 as a common node, or a reference conductor, to consider its potential ($V_A$, $V_C$ respectively) as being constant or zero ($V_{ref}=V_A=0$, or $V_{ref}=V_C=0$) and to relate all other potentials to that potential. The waveform of u'(t) can be harmonic (sine) or other (rectangular, sawtooth, etc.). By means of the operational amplifier 9 connected as voltage follower, the potential waveform in the second node 4 is followed. The input impedance of the operational amplifier 9 should be many times higher than the maximum value of resistance of actively controlled resistor network 3 to prevent undesired load of the divider. The potential waveform at the output of the operational amplifier 9 ($v_B(t)$) then corresponds to the superposition of (i) applied voltage $u_{in}(t)$ divided by the divider formed by the resistance of the sensor $R_s$ and the resistance of the actively controlled resistor network 3 $R_{ACRN}$ and (ii) of potential induced as a result of EMI ($v_{EMI}(t)$):

$$v_B(t) = \frac{R_{SET}}{R_s + R_{SET}} u_{in}(t) + v_{EMI}(t) \text{ for } V_{ref} = V_A, \quad (7a)$$

$$V_B(t) = \frac{R_s}{R_s + R_{SET}} u_{in}(t) + v_{EMI}(t) \text{ for } V_{ref} = V_C. \quad (7b)$$

Parasitic capacitances between GATE and DRAIN or SOURCE electrodes of transistors in the actively controlled resistor network 3 and the capacitance of the shielded cable 8, in case of its usage between the second node 4 and the sensor 5, together with resistors in the divider, form a low-pass filter which can decrease amplitude of the potential $v_B(t)$ depending on the frequency of $u_{in}(t)$. The elimination of this low-pass filter can be achieved by superposition of $v_B(t)$ on the potential applied on GATE electrodes of switching transistors of the actively controlled resistor network 3 and by applying $v_B(t)$ on the shielding layer of the shielded cable 8, if used. Thus, it is ensured that the parasitic capacitors are charged by a source with low output impedance (operational amplifier 9) and that they do not load the voltage divider. If the potential of the GATE electrode causing switching on of a given transistor is referred as $V_G$, potential of the GATE electrode applied for the purpose of switching the transistor T1 off and on is referred to as $V_{off}$ and $V_{on}$, respectively, it is necessary to ensure that $V_{on}+V_B(t)>V_G\char`\^V_{off}+v_B(t)<V_G$ for transistors with N-channel $V_{on}+V_B(t)<V_G\char`\^V_{off}+v_B(t)>V_G$ for transistors with P-channel.

Conditions mentioned above can be fulfilled by the selection of sufficiently low amplitude of $u_{in}(t)$ and, in case of strong interference, the output of operational amplifier 9 can be subjected to filtration by an analog filter passing fully the frequency of $u_{in}(t)$ and suppressing EMI frequencies.

A necessary prerequisite for determining the resistance of the sensor is elimination of the effect of EMI. The output of the operational amplifier 9 filtered by an analog or digital filter ($v_{B,f}(t)$) corresponds to the potential waveform in the second node 4 modified by the transfer function H of a given filter, i.e. after being introduced to the relations (7a) or (7b):

$$v_{B,f}(t) = \frac{R_{ACRN}}{R_s + R_{ACRN}} H(u_{in}(t)) + H(v_{EMI}(t))v_{B,f}(t) = \qquad (8a)$$

$$\frac{R_{ACRN}}{R_s + R_{SACRN}} H(u_{in}(t)) + H(v_{EMI}(t)) \text{ for } V_{ref} = V_A$$

$$v_{B,f}(t) = \frac{R_S}{R_s + R_{ACRN}} H(u_{in}(t)) + H(v_{EMI}(t))v_{B,f}(t) = \qquad (8b)$$

$$\frac{R_S}{R_s + R_{ACRN}} H(u_{in}(t)) + H(v_{EMI}(t)) \text{ for } V_{ref} = V_C$$

it is preferred to select the filter so that $H(v_{EMI}(t))=0$ (elimination of effect of EMI); the following then applies:

$$v_{B,f}(t) = \frac{R_{ACRN}}{R_s + R_{ACRN}} H(u_{in}(t)) \text{ for } V_{ref} = V_A \qquad (9a)$$

$$v_{B,f}(t) = \frac{R_S}{R_s + R_{ACRN}} H(u_{in}(t)) \text{ for } V_{ref} = V_C \qquad (9b)$$

On the basis of the relation (9a) or (9b), the knowledge of transmitting function of the filter H, and the currently set value of resistance of the actively controlled resistor network 3 $R_{ACRN}$, it is possible to determine the resistance of the sensor 5 $R_s$.

Figure 5:
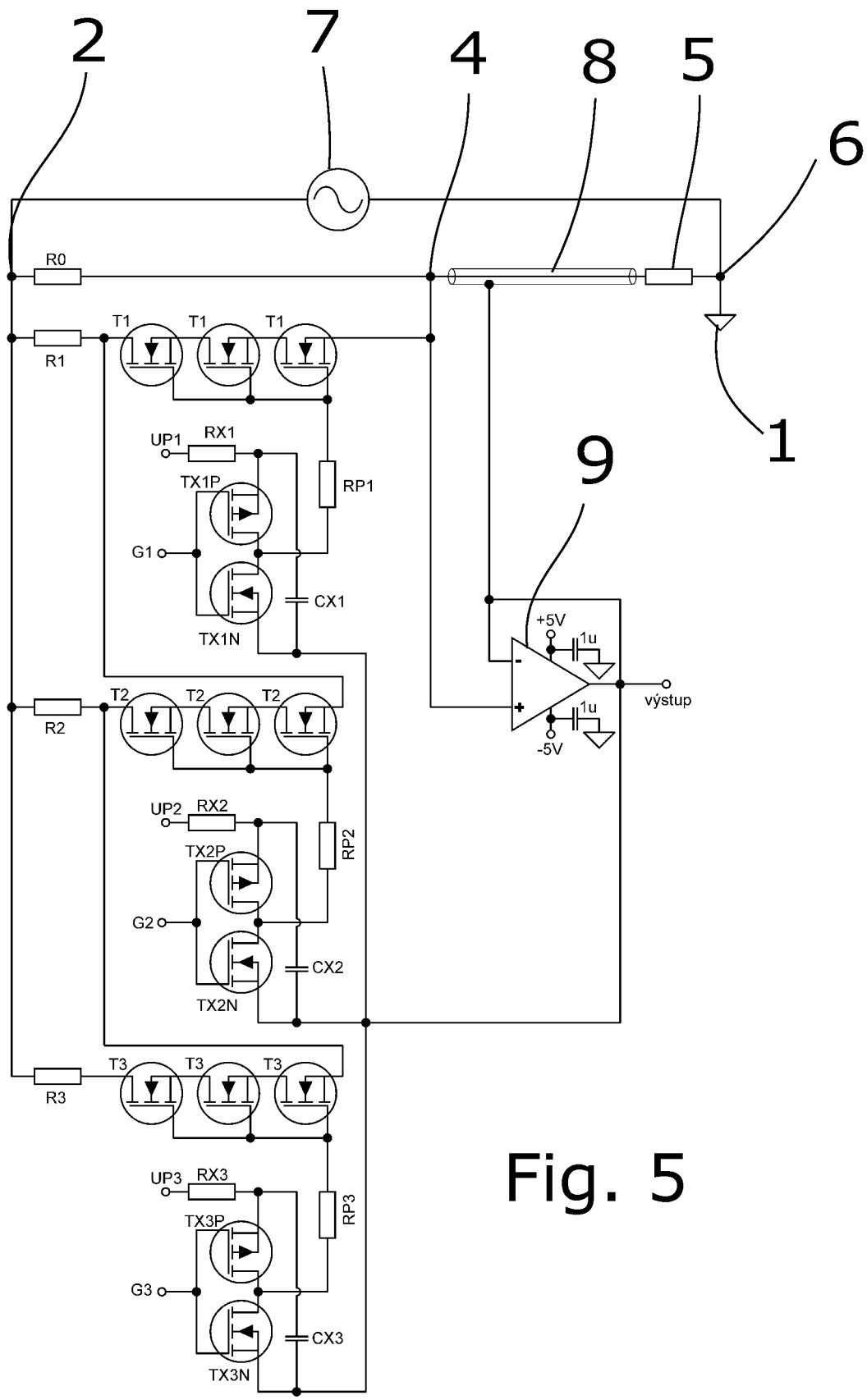

An example of an embodiment of the invention is in FIG. 5. A harmonic voltage waveform with the amplitude of 300 mV and the frequency of 55 Hz is applied on the voltage divider formed by the actively controlled resistor network 3 and the resistor $R_s$ (it simulates resistance of the sensor 5). The potential between the actively controlled resistor network 3 and $R_s$ (with all potentials referred to the common node) is followed by the operational amplifier 9 with FET inputs connected as a voltage follower. The actively controlled resistor network 3 contains branch resistors R0-R3 connected in the way according to FIG. 4b. Triplets of switching MOSFET transistors T1-T3 connect the corresponding branch resistors R1-R3 in parallel to the permanently connected branch resistor R0 and thus change the resistance of actively controlled resistor network 3 of parallel resistors. The potential applied to GATE electrodes of switching transistors T1 is selected by the potential applied on GATE electrodes of the auxiliary switching transistors TX1N and TX1P. If the common potential G1 of GATE electrodes of the first and the second auxiliary switching transistor TX1N and TX1P is higher than the threshold voltage of these auxiliary switching transistors (e.g. G1=+5 V), the second auxiliary switching transistor TX1N is opened and the first auxiliary switching transistor TX1P is closed. Then, the potential on GATE electrodes of switching transistors T1 has directly the output value of the operational amplifier 9 which can take up the value between +150 and −150 mV (voltage applied on the divider). These values are lower than the threshold voltage of switching transistors T1, which are thus closed, and the resistance of actively controlled resistor network 3 is determined by the value of resistance of the permanently connected resistor R0.

In case that the common potential G1 of GATE electrodes of the first and the second switching transistor TX1N and TX1P is lower than the threshold voltage of these auxiliary switching transistors (e.g. 0 V), the second auxiliary switching transistor TX1N is closed and the first auxiliary switching transistor TX1P is opened. Then, the potential on GATE electrodes of switching transistors T1 has a DC component UP1 and an AC component determined by the output of the operational amplifier 9 which is provided by the second auxiliary resistor RX1 and the auxiliary capacitor CX1; an appropriate potential UP1 is selected (e.g. +5 V) so that the potential on GATE electrodes of switching transistors T1 has, in every time point, a higher value than the threshold value of the switching transistors T1 which are therefore opened. The resistance of actively controlled resistor network 3 is determined by a parallel connection of the permanently connected branch resistor R0 and the branch resistor R1.

In an entirely analogous way, the branch resistors R2 and R3 are connected through common potentials of GATE electrodes of auxiliary switching transistors G2 or G3. To connect the branch resistor R2, it is necessary to connect the branch resistor R1 as well; analogously, to connect the branch resistor R3, it is necessary to connect the branch resistors R1 and R2 as well. The resistance of actively controlled resistor network 3 for values of resistance of branch resistors R0-R3 shown in FIG. 5 depending on common potentials of GATE electrodes G1-G3 of the auxiliary switching transistors is shown in Table 1.

TABLE 1

| G1 (V) | G2 (V) | G3 (V) | $R_{ACRN}$ |
|---|---|---|---|
| +5 | +5 | +5 | $R_0$ = 100 MΩ |
| 0 | +5 | +5 | $R_0 \| R_1$ = 9,09 MΩ |
| 0 | 0 | +5 | $R_0 \| R_1 \| R_2$ = 1,06 MΩ |
| 0 | 0 | 0 | $R_0 \| R_1 \| R_2 \| R_3$ = 91,4 kΩ |

Figure 6:
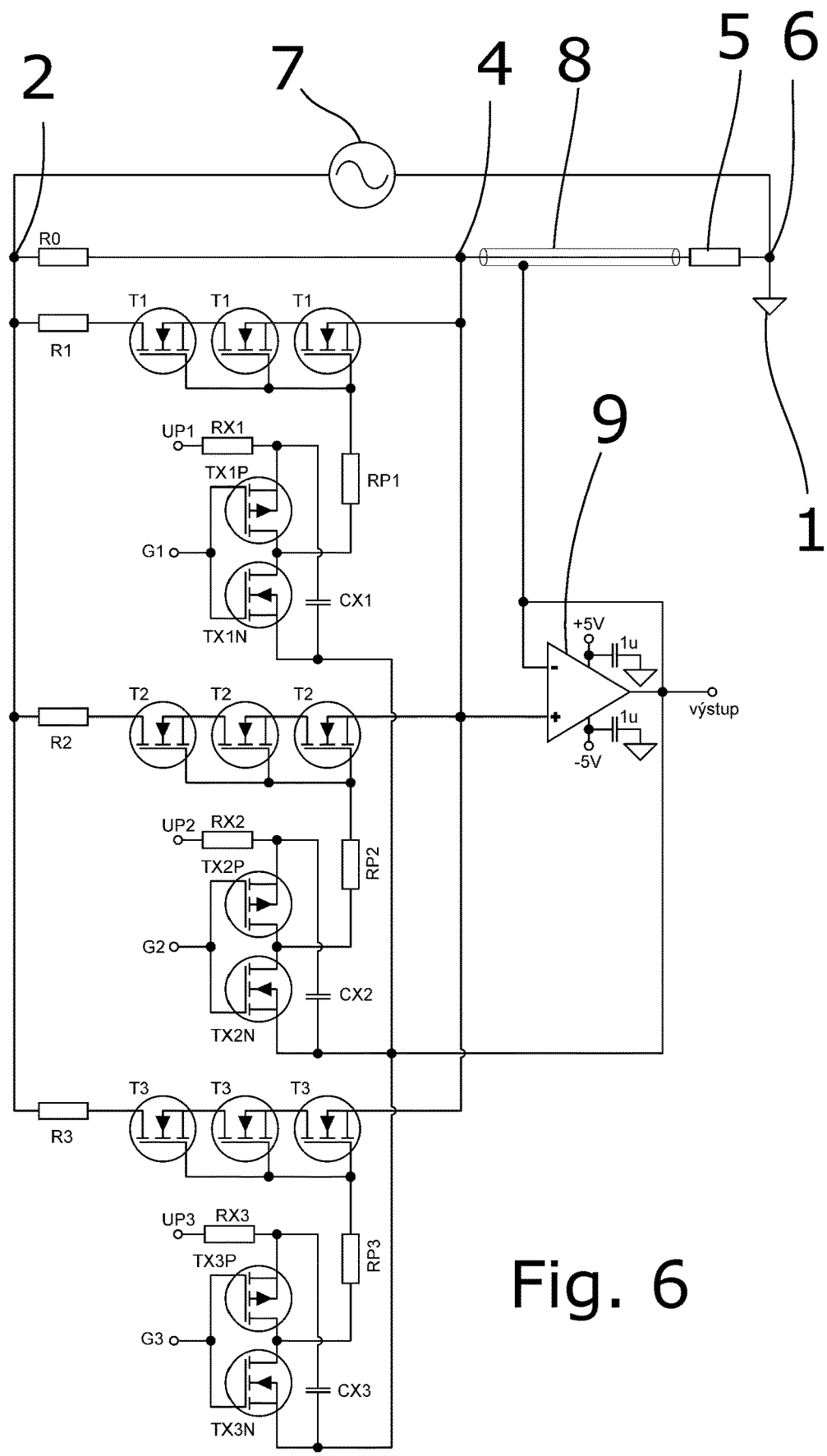
Figure 7:
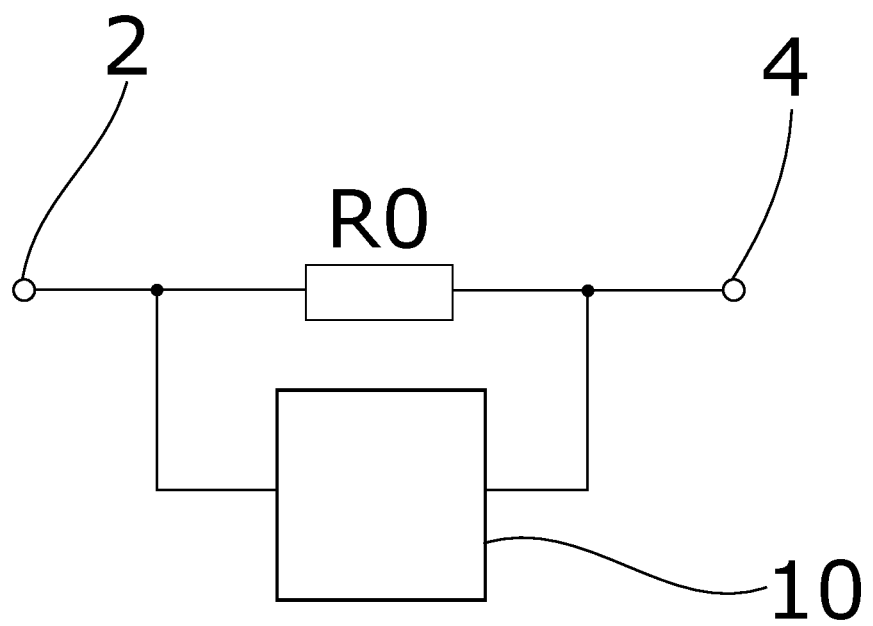

Another option of the connection is shown in FIG. 6. Actively controlled resistor network 3 contains branch resistors R0-R3 connected according to FIG. 4a. Connection of the branch resistors is achieved by the method described above by means of common potentials of GATE electrodes of the auxiliary switching transistors G1-G3. Unlike in the previous arrangement (FIG. 5), it is possible to connect individual branch resistors independently of the connection of the other branch resistors. Resistance of actively controlled resistor network 3 depending on the common potentials of GATE electrodes of the auxiliary switching transistors G1-G3 is, similarly as in the previous case, determined as the resistance of parallel connection of the connected branch resistors.

The shielded cable 8 is used to connect non-inverting input of the operational amplifier 9 and the resistive sensor 5. The output of the operational amplifier 9 is applied on the shielding layer of the shielded cable 8 for the purpose of suppressing the effect of capacitance of the shielded cable 8.

LIST OF REFERENCE SIGNS

1—Reference Conductor
2—First Node
3—Actively controlled resistor network
4—Second Node
5—Resistive Sensor
6—Third Node
7—_Periodic Waveform Voltage Source
8—Shielded Cable
9—Operational Amplifier
10—Branch of Actively Controlled Resistor Network
RD—Resistance of Divider
R0—Permanently Connected Branch Resistor
R1—Branch Resistor of the First Branch of actively controlled resistor network
R2—Branch Resistor of the Second Branch of actively controlled resistor network R3—Branch Resistor of the Third Branch of actively controlled resistor network
T1—Switching Transistor MOSFET of the First Branch of actively controlled resistor network
T2—Switching Transistor MOSFET of the Second Branch of actively controlled resistor network
T3—Switching Transistor MOSFET of the Third Branch of actively controlled resistor network
RP1—First Auxiliary Resistor of the First Branch of actively controlled resistor network
RP2—First Auxiliary Resistor of the Second Branch of actively controlled resistor network
RP3—First Auxiliary Resistor of the Third Branch of actively controlled resistor network
TX1P—First Auxiliary Switching Transistor MOSFET of the First Branch of actively controlled resistor network
TX1N—Second Auxiliary Switching Transistor MOSFET of the First Branch of actively controlled resistor network
TX2P—First Auxiliary Switching Transistor MOSFET of the Second Branch of actively controlled resistor network
TX2N—Second Auxiliary Switching Transistor MOSFET of the Second Branch of actively controlled resistor network
TX3P—First Auxiliary Switching Transistor MOSFET of the Third Branch of actively controlled resistor network
TX3N—Second Auxiliary Switching Transistor MOSFET of the Third Branch of actively controlled resistor network
G1—Common Potential of GATE Electrodes of the First and Second Auxiliary Switching Transistors of the First Branch of actively controlled resistor network
G2—Common Potential of GATE Electrodes of the First and Second Auxiliary Switching Transistors of the Second Branch of actively controlled resistor network
G3—Common Potential of GATE Electrodes of the First and Second Auxiliary Switching Transistors of the Third Branch of actively controlled resistor network
RX1—Second Auxiliary Resistor of the First Branch of actively controlled resistor network
RX2—Second Auxiliary Resistor of the Second Branch of actively controlled resistor network
RX3—Second Auxiliary Resistor of the Third Branch of actively controlled resistor network
CX1—Auxiliary Capacitor of the First Branch of actively controlled resistor network
CX2—Auxiliary Capacitor of the Second Branch of actively controlled resistor network
CX3—Auxiliary Capacitor of the Third Branch of actively controlled resistor network
UP1—Auxiliary Potential of the First Branch of actively controlled resistor network
UP2—Auxiliary Potential of the Second Branch of actively controlled resistor network
UP3—Auxiliary Potential of the Third Branch of actively controlled resistor network

The invention claimed is:

1. A device for measuring resistance of a resistive sensor including a periodic waveform voltage source having two terminals, an actively controlled resistor network having two terminals, and a resistive sensor having two terminals wherein the first terminal of the periodic waveform voltage source is connected to a first node and the second terminal of the periodic waveform voltage source is connected to a third node, the first terminal of the actively controlled resistor network is connected to the first node and the second terminal of the actively controlled resistor network is connected to a second node, and the first terminal of the resistive sensor is connected to the second node and the second terminal of the resistive sensor is connected to the third node, the device is further comprising an operational amplifier, wherein the non-inverting input of the operational amplifier is connected to the second node and the output of the operational amplifier is connected to an inverting input, the actively controlled resistor network comprises at least one branch comprising at least a switching transistor, a branch resistor connected in series with a switching transistor, one terminal of said branch resistor being connected to the first node, the branch further comprising a first auxiliary switching transistor, a second auxiliary switching transistor, an auxiliary resistor connecting the DRAIN electrodes of the first auxiliary switching transistor and the second auxiliary switching transistor with the GATE electrode of the switching transistor, a second auxiliary resistor connecting the SOURCE electrode of the first auxiliary switching transistor to an auxiliary potential, an auxiliary capacitor connecting the SOURCE electrodes of the first auxiliary switching transistor and the second auxiliary switching transistor, wherein the GATE electrodes of the first auxiliary switching transistor and the second auxiliary switching transistor are at the same potential, wherein the output of the operational amplifier is superimposed on the GATE electrode of the switching transistor, SOURCE electrode of the second auxiliary transistor and via the auxiliary capacitor on the SOURCE electrode of the second auxiliary transistor, wherein the voltage of the periodic waveform voltage source has, throughout the whole duration of the period, lower value than the threshold voltage of switching transistors.

2. The device according to claim 1 wherein said device contains at least two branches of the actively controlled resistor network.

3. The device according to claim 1 wherein the actively controlled resistor network contains a permanently connected branch resistor having two terminals, wherein the first terminal is connected to the first node and the second terminal is connected to the second node.

4. The device according to claim 3 wherein said device contains at least one branch of the actively controlled resistor network connected in parallel to the permanently connected branch resistor.

5. The device according to claim 3 wherein an input impedance of the operational amplifier is higher than the value of resistance of the permanently connected branch resistor.

6. The device according to claim 1 wherein the values of resistance of branch resistors of branches of the actively controlled resistor network form geometric series.

7. The device according to claim 1 wherein the branch of the actively controlled resistor network contains at least two switching transistors connected in series.

8. The device according to claim 1 wherein a second branch of the actively controlled resistor network with the branch resistor is connected in parallel to the branch resistor of the first branch of the actively controlled resistor network.

9. The device according to claim 1 wherein the resistive sensor and the actively controlled resistor network are connected by a shielded cable.

10. The device according to claim 9 wherein the non-inverting input of the operational amplifier is connected with the shielded cable and the output of the operational amplifier is connected to a shielding layer of the shielded cable.

11. A method of measuring resistance of a resistive sensor with the device according to claim 1 wherein the value of resistance of the resistive sensor is determined by applying a periodical voltage waveform between the first node and the third node by the periodic waveform voltage source, wherein the voltage of the periodic waveform voltage source has, throughout the whole duration of the period, lower value than the threshold voltage of switching transistors, measuring a potential at the second node, wherein the measured potential is a function of a resistance of the resistive sensor.

12. The method of measuring resistance of the resistive sensor according to claim 11 wherein the voltage of the periodic waveform voltage source is in the form of a harmonic signal.

13. The method of measuring resistance of the resistive sensor according to claim 11 wherein the voltage of the periodic waveform voltage source is in the form of a rectangular signal or sawtooth signal or another periodical signal waveform.

14. The method of measuring resistance of the resistive sensor according to claim 11 wherein the output of the operational amplifier is filtered by analog or digital filter passing only the frequency of the periodic waveform voltage source.

* * * * *